United States Patent [19]
Kenji et al.

[11] Patent Number: 5,585,743
[45] Date of Patent: Dec. 17, 1996

[54] ECL-CMOS LEVEL CONVERSION CIRCUIT

[75] Inventors: Hisashige Kenji; Noboru Yokota, both of Kawasaki, Japan

[73] Assignee: Fujitsu Limited, Kawasaki, Japan

[21] Appl. No.: 570,830

[22] Filed: Dec. 12, 1995

Related U.S. Application Data

[63] Continuation of Ser. No. 136,045, Oct. 14, 1993, abandoned.

[30] Foreign Application Priority Data

Oct. 14, 1992 [JP] Japan .................................. 4-276277

[51] Int. Cl.$^6$ .................... H03K 19/094; H03K 19/0175
[52] U.S. Cl. ............................................. 326/73; 326/68
[58] Field of Search ................................. 307/475, 451, 307/455; 326/73, 68

[56] References Cited

U.S. PATENT DOCUMENTS

| | | | |
|---|---|---|---|
| 4,437,171 | 3/1984 | Hudson et al. | 307/475 |
| 4,453,095 | 6/1984 | Wrathall | 307/475 |
| 4,563,601 | 1/1986 | Asano et al. | 307/475 |
| 5,075,578 | 12/1991 | Wendell | 307/475 |
| 5,153,465 | 10/1992 | Sandhu | 307/475 |
| 5,216,298 | 6/1993 | Ohba et al. | 307/475 |
| 5,293,081 | 3/1994 | Chiao et al. | 307/475 |
| 5,329,183 | 7/1994 | Tamegaya | 307/475 |

FOREIGN PATENT DOCUMENTS

| | | |
|---|---|---|
| 59-139727 | 8/1984 | Japan . |
| 63-015519 | 1/1988 | Japan . |
| 3-283813 | 12/1991 | Japan . |

*Primary Examiner*—Edward P. Westin
*Assistant Examiner*—Richard Roseen
*Attorney, Agent, or Firm*—Staas & Halsey

[57] ABSTRACT

In a level conversion circuit for converting a pair of first-level signals into a pair of second-level signals, an input buffer circuit converts the pair of first-level signals into a pair of buffered signals which vary within a first voltage range situated below a second voltage range within which the pair of first-level signals vary. An amplifier circuit, which includes a plurality of CMOS differential amplifier circuits cascaded, converts the pair of buffered signals into the pair of second-level signals varying within a third voltage range broader than the second voltage range of the pair of first-level signals.

13 Claims, 11 Drawing Sheets

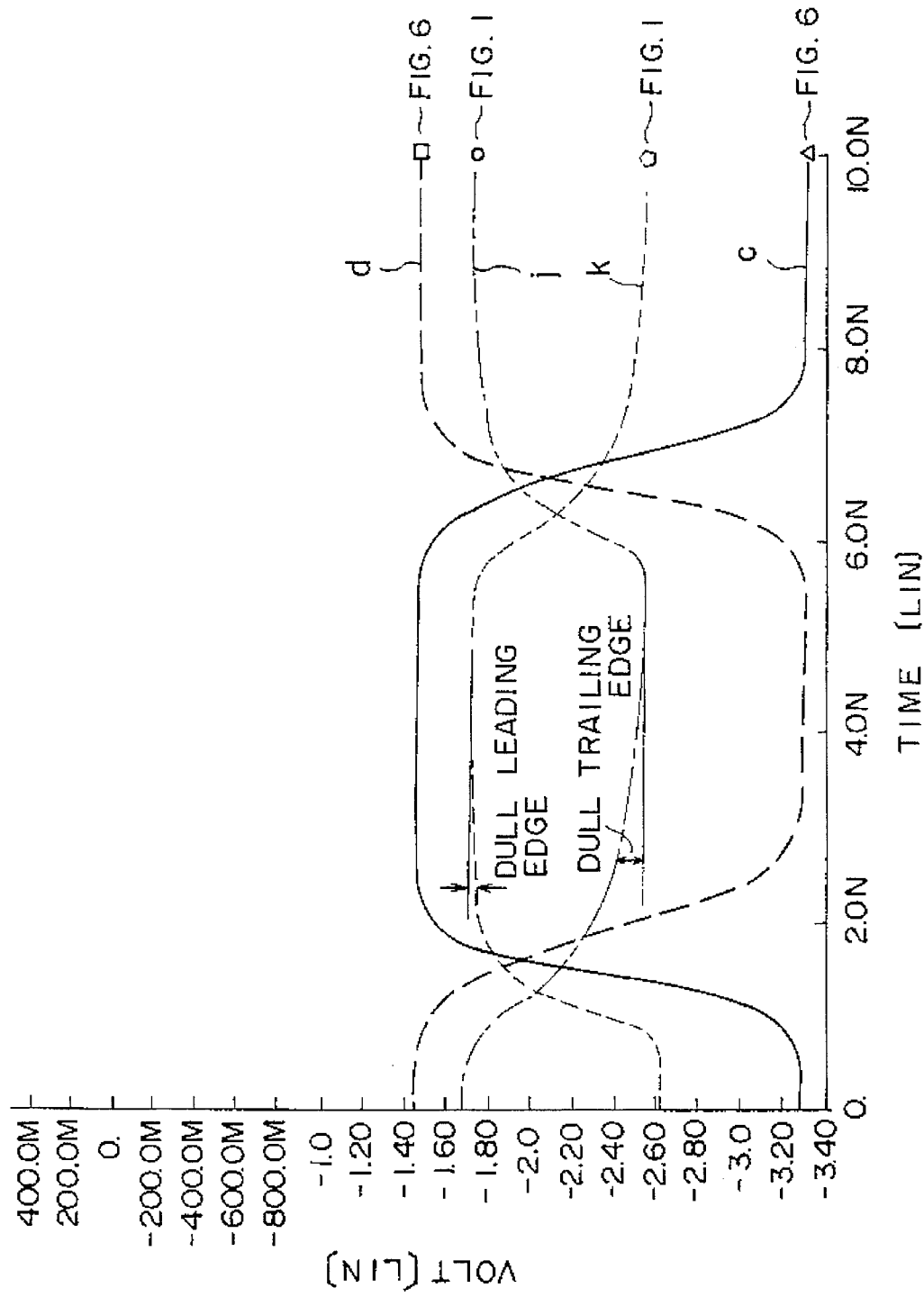

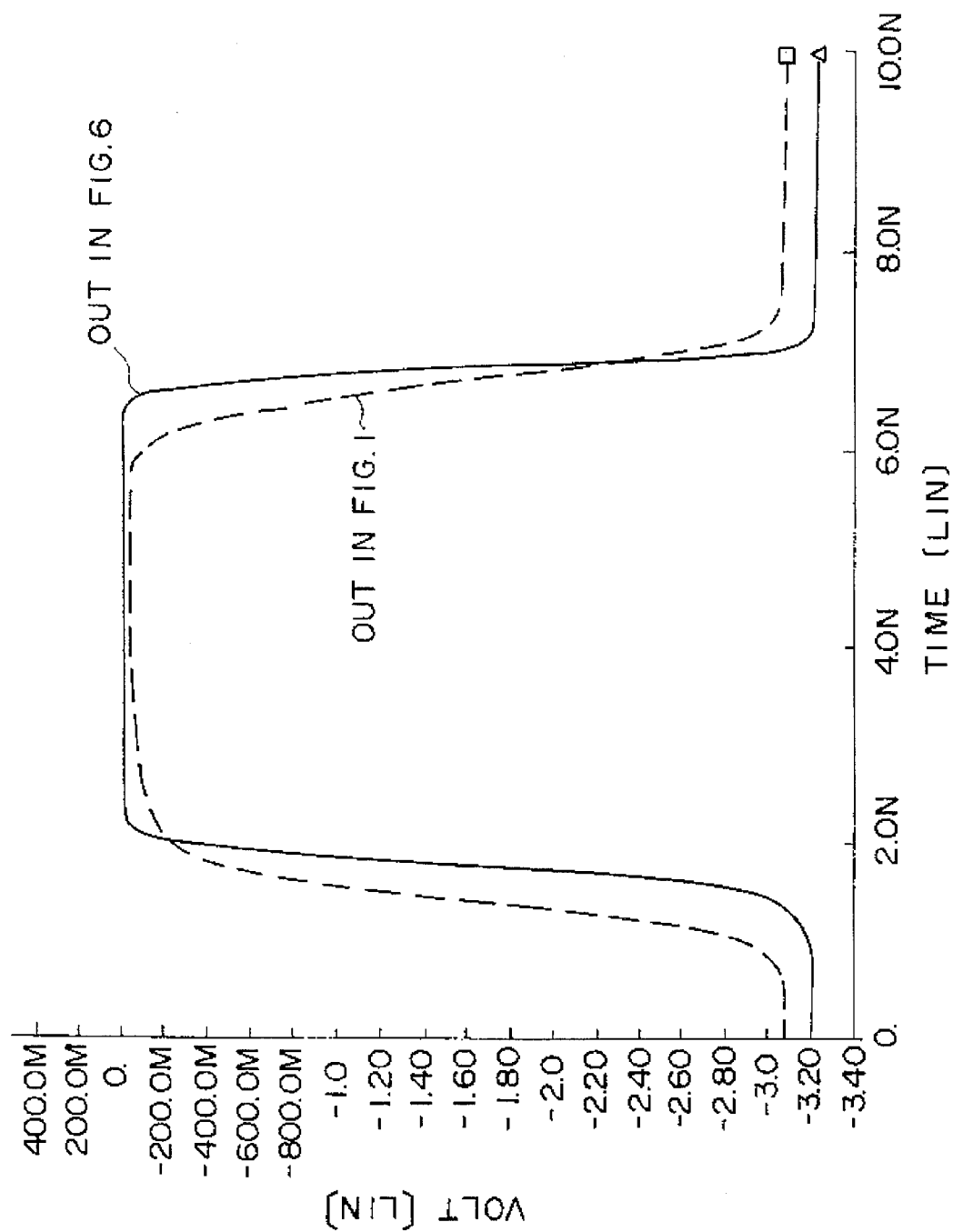

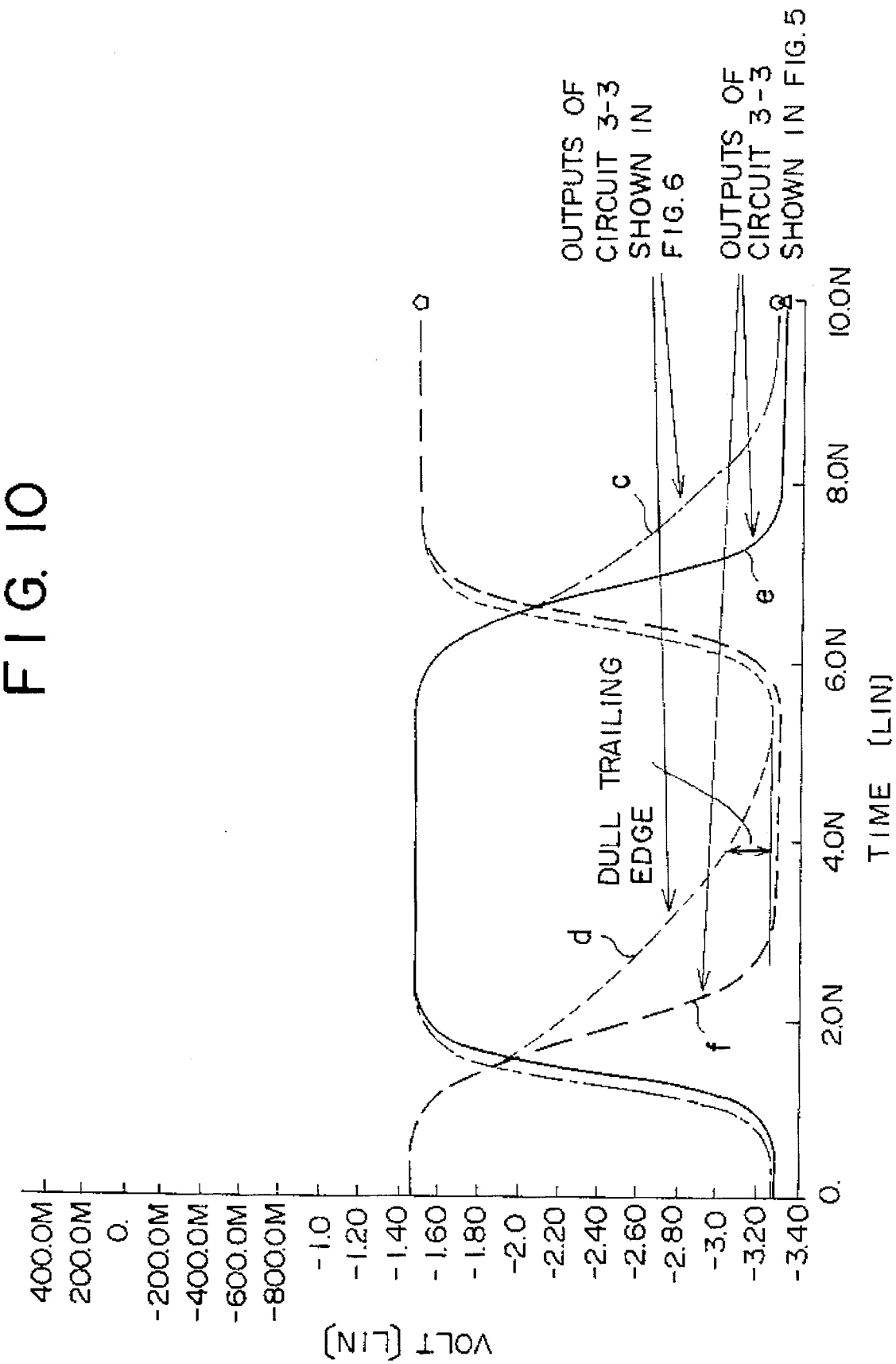

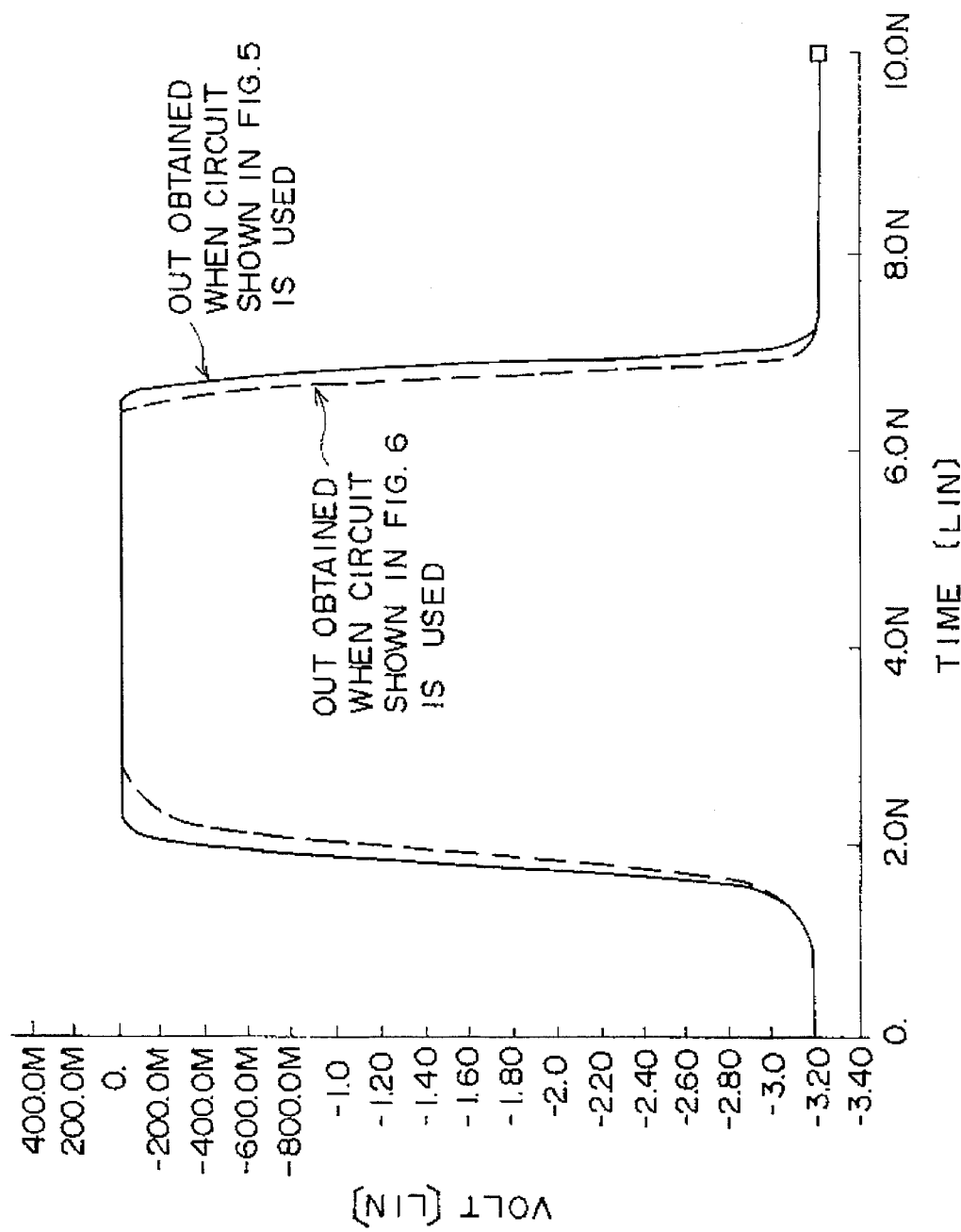

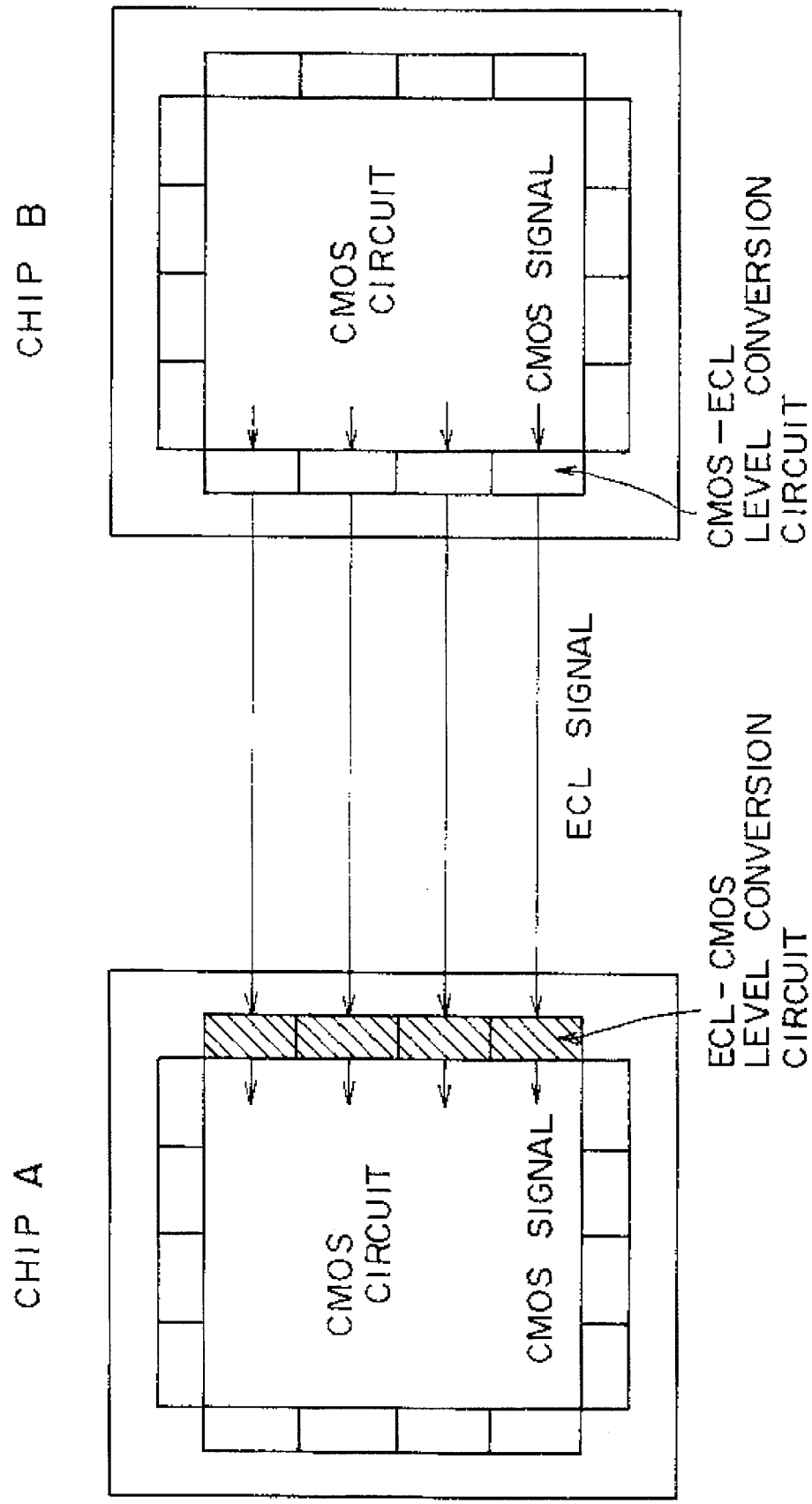

ECL-CMOS LEVEL CONVERSION CIRCUIT

This application is a continuation of application Ser. No. 08/136,045, filed Oct. 14, 1993, now abandoned.

BACKGROUND OF THE INVENTION

1. Field of the Invention

The present invention generally relates to an ECL-CMOS (Emitter-Coupled Logic/Complementary Metal Oxide Semiconductor) level conversion circuit for converting an ECL-level signal into a CMOS-level signal, and more particularly to an ECL-CMOS level conversion circuit including CMOS circuits.

2. Description of the Prior Art

Recently the operating speed of integrated circuits has been increased, and accordingly an interface circuitry operating with low-amplitude signals like those of ECL has been required. Particularly, there are recent development trends to design circuit configurations in which a logic circuit is formed by a CMOS circuit of low power consumption and high integration density and an interface between the logic circuit and an external circuit is established by a level conversion circuit.

Various ECL-CMOS or CMOS-ECL level conversion circuits using Bi-CMOS (Bipolar/CMOS) circuits have been proposed (for example, Japanese Laid-Open Patent Application No. 3-283813). An ECL interface is capable of transferring data at a speed of 100 MHz or higher.

An ECL-CMOS level conversion circuit of a CMOS configuration is known (for example, Japanese Laid-Open Patent Application No. 63-15519). Normally, the design of CMOS circuits is more complicated than that of Bi-CMOS circuits because the operation characteristics of CMOS circuits are less stable than those of Bi-CMOS circuits. Further, the operating speed of CMOS circuits are lower than that of Bi-CMOS circuits. On the other hand, CMOS circuits can be formed on a chip by a production process simpler than that of Bi-CMOS circuits.

Most recently proposed ECL-CMOS level conversion circuits have the CMOS configuration. However, since the CMOS circuits can be easily formed on a chip, it is desired to provide an ECL-CMOS level conversion circuit of the CMOS type capable of stably operating at a high speed.

SUMMARY OF THE INVENTION

It is an object of the present invention to provide an ECL-CMOS level conversion circuit of a CMOS configuration capable of stably operating at a high speed.

This object of the present invention is achieved by a level conversion circuit for converting a pair of first-level signals into a pair of second-level signals, the level conversion circuit being supplied with a high-potential power supply voltage and a low-potential power supply voltage, the level conversion circuit comprising: input buffer for converting the pair of first-level signals into a pair of buffered signals which vary within a first voltage range situated below a second voltage range within which the pair of first-level signals vary; and an amplifier circuit comprising a plurality of CMOS differential amplifier circuits cascaded, the amplifier circuit converting the pair of buffered signals into the pair of second-level signals varying within a third voltage range broader than the second voltage range of the pair of first-level signals.

BRIEF DESCRIPTION OF THE DRAWINGS

Other objects, features and advantages of the present invention will become more apparent from the following detailed description when read in conjunction with the accompanying drawings, in which:

FIG. 8 is a graph of the characteristics of the final-stage differential amplifier circuit shown in FIGS. 1 and 6;

FIG. 9 is a graph of the characteristics of CMOS-level output signals output by the output inverter circuits shown in FIGS. 1 and 6;

FIG. 10 is a graph of the characteristics of the final-stage differential amplifier circuits shown in FIGS. 5 and 6;

FIG. 11 is a graph of the characteristics of the CMOS-level output signals obtained when the final-stage differential amplifier circuits shown in FIGS. 5 and 6 are used; and FIG. 12 is a block diagram of an application of the present invention.

DESCRIPTION OF THE PREFERRED EMBODIMENTS

Figure 1:
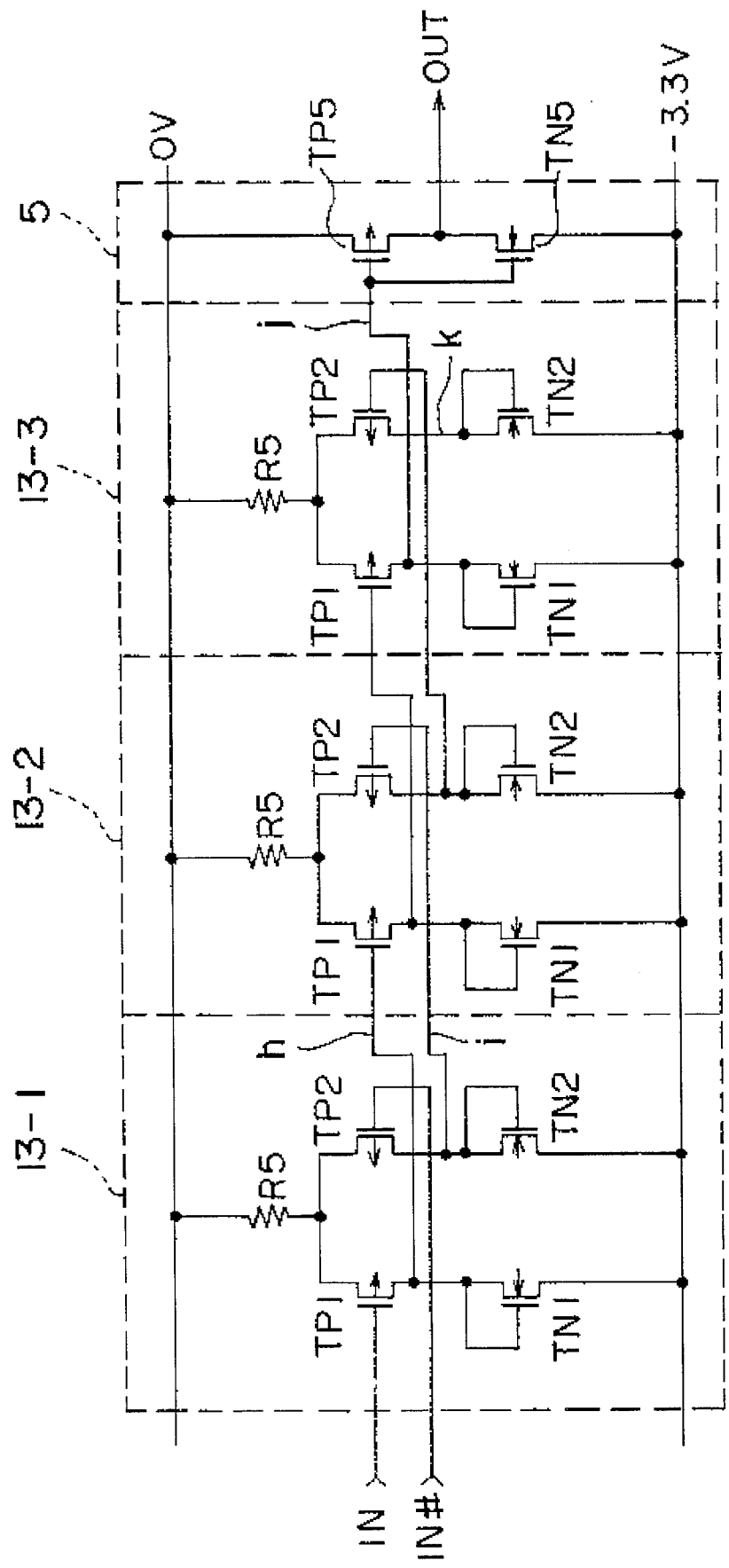
FIG. 1 is a circuit diagram of a conventional ECL-CMOS level conversion circuit of a CMOS type.

FIG. 1 is a circuit diagram of a conventional ECL-CMOS level conversion circuit of the CMOS type. The ECL-CMOS level conversion circuit shown in FIG. 1 is made up of three cascaded differential amplifier circuits 13-1, 13-2 and 13-3, and an output inverter circuit 5. Each of the differential amplifier circuits 13-1, 13-2 and 13-3 includes two P-channel MOS transistors (PMOS transistors) TP1 and TP2, two N-channel MOS transistors (NMOS transistors) TN1 and TN2, and a resistor R5. Complementary ECL-level input signals IN and IN# are applied to the gates of the PMOS transistors TP1 and TP2 of the circuit 13-1, respectively. The drains of the PMOS transistors TP1 and TP2 of the circuit 13-1 are connected to the gates of the PMOS transistors TP1 and TP2 of the circuit 13-2, respectively. The output inverter circuit 5 is formed with a CMOS inverter consisting of a PMOS transistor TP5 and an NMOS transistor TN5. A CMOS-level output signal is available at a connection node at which the drains of the transistors TP5 and TN5 are connected together. A high-potential power supply voltage VDD of 0V and a low-potential power supply voltage VSS of −3.3V are applied to the circuit shown in FIG. 1.

The reason why a plurality of amplifier circuits are cascaded is that if a single amplifier stage is employed, it will take a long time for the CMOS-level signal to switch between high and low levels in response to a switching of the ECL-level input signal. Therefore, the level conversion circuit cannot operate at high speed, because the ECL levels are quite different from CMOS levels. By using a plurality of amplifier circuits, it becomes possible to reduce the level difference between the input and output of each of the amplifiers.

As will be described later, the ECL-CMOS level conversion circuit shown in FIG. 1 does not have sharp leading and trailing edges in the waveform of the CMOS-level signal.

The present invention is intended to provide an improved ECL-CMOS level conversion circuit of the CMOS type.

Figure 2:
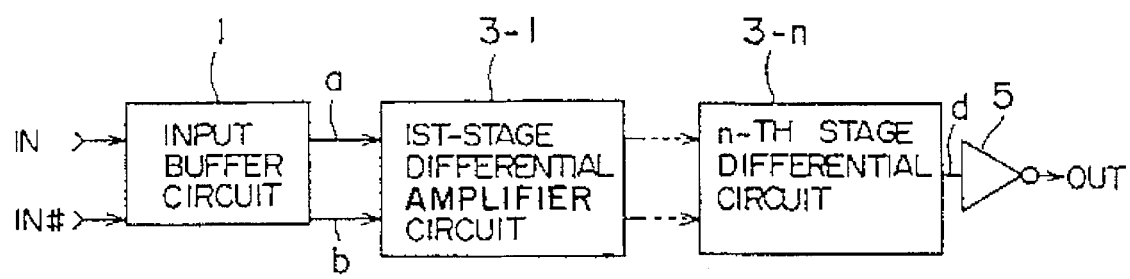
FIG. 2 is a block diagram of the principle of an ECL-CMOS level conversion circuit according to the present invention.

FIG. 2 is a block diagram of the principle of the present invention. An ECL-CMOS level conversion circuit of the CMOS type shown in FIG. 2 includes an input buffer circuit 1, n differential amplifier circuits 3-1 through 3-n where n is an integer, and the output buffer circuit 5. One possibility for the configuration in FIG. 2 (n=3) is to add circuit 1 to the configuration of FIG. 1. 10 The input buffer circuit 1 receives the ECL-level signals IN and IN#, and outputs level-converted output signals a and b to the first-stage differential amplifier circuit 3-1. The output signals a and b have levels lower than those of the ECL-level signals IN and IN# and higher than the low-potential power supply voltage VSS. For example, the ECL-level signals IN and IN# vary between −1.8V and −0.9V, and the low-potential power supply voltage VSS is −3.3V. In this case, the output signals a and b of the input buffer circuit 1 vary between approximately −3.0V and −2.6V. This voltage range of the output signals a and b can be more easily processed by the first-stage differential amplifier circuit 3-1 of the CMOS type than the voltage range of the ECL-level input signals IN and IN#.

More particularly, the ECL-level signals IN and IN# are too high to enable amplification of these signals by the PMOS transistors TP1 and TP2 of the first-stage circuit 3-1. Further, it is desired that the output signals of the first-stage circuit 3-1 vary within a voltage range as small as possible in order to gradually amplify the amplitudes of the signals by means of the differential amplifier circuits 3-1 through 3-n. From these viewpoints, the ECL-level input signals IN and IN# are shifted to a voltage range lower than the ECL levels and slightly higher than the low-potential power supply voltage VSS. Hence, the PMOS transistors TP1 and TP2 can be made to operate in an approximately saturated state.

Figure 3:
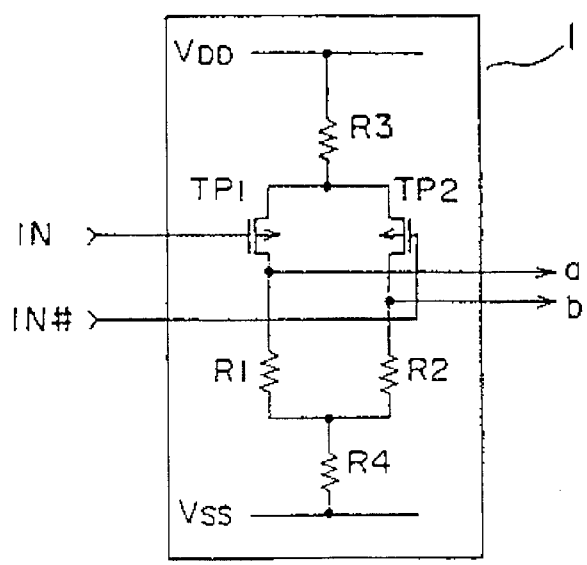
FIG. 3 is a circuit diagram of an input buffer circuit shown in FIG. 2.

FIG. 3 is a circuit diagram of the input buffer circuit 1, which is made up of two PMOS transistors TP1 and TP2, and four resistors R1, R2, R3 and R4. The ECL-level input signals IN and IN# are applied to the gates of the PMOS transistors TP1 and TP2, respectively. A VDD power supply line is coupled to the sources of the PMOS transistors TP1 and TP2 via the resistor R3. The drains of the PMOS transistors TP1 and TP2 are connected to one end of the resistor R4 via the resistors R1 and R2, respectively. The other end of the resistor R4 is connected to a VSS power supply line. The output signals a and b are output from the drains of the PMOS transistors TP1 and TP2, respectively.

Figure 4:
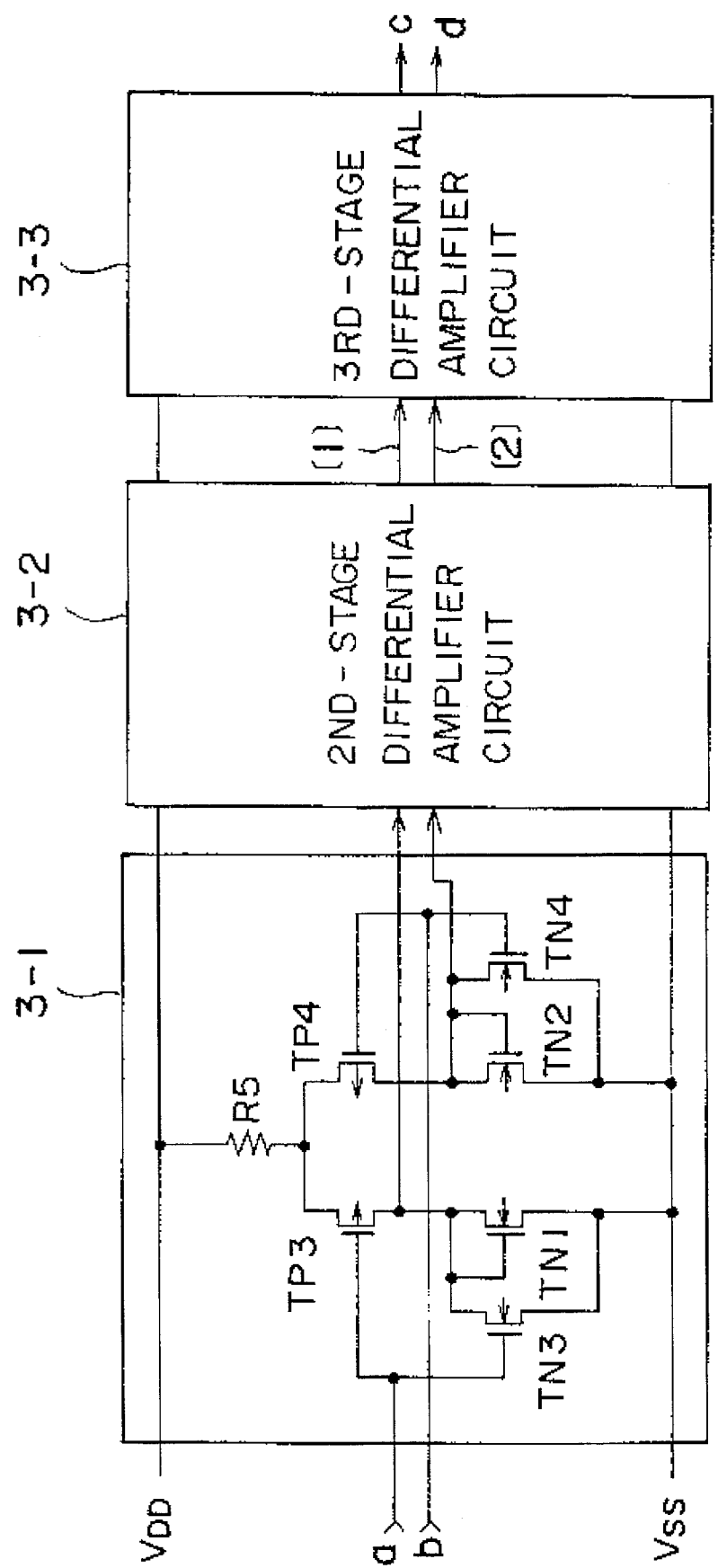
FIG. 4 is a circuit diagram of a differential amplifier circuit shown in FIG. 2.

It is preferable that each of the differential amplifier circuits 3-1 through 3-n has a configuration shown in FIG. 4, in which the circuit configuration of only the circuit 3-1 is illustrated for the sake of simplicity. In FIG. 4, parts that are the same as those shown in the previously described figures are given the same reference numbers as previously. The differential amplifier circuit 3-1 shown in FIG. 4 is configured by adding NMOS transistors TN3 and TN4 to the circuit configuration shown in FIG. 1.

More particularly, the gate of the NMOS transistor TN3 receives the output signal a of the input buffer circuit 1, and the gate of the NMOS transistor TN4 receives the output signal b thereof. The drain of the NMOS transistor TN3 is connected to the drain of the PMOS transistor TP3 and the drain and gate of the NMOS transistor TN1. Similarly, the drain of the NMOS transistor TN4 is connected to the drain of the PMOS transistor TP4 and the drain and gate of the NMOS transistor TN2. The sources of the NMOS transistors TN3 and TN4 are connected to the sources of the NMOS transistors TN1 and TN2, respectively.

The NMOS transistors TN3 and TN4 facilitate a discharging operation. The transistor TN3 immediately responds to a change of the signal a before a change in the state of the associated PMOS transistor TP3. Similarly, the transistor TN4 immediately responds to a change of the signal b before a change in the state of the associated PMOS transistor TP4. In this manner, the nodes from which the output signals are drawn can be discharged more rapidly than the nodes in the configuration shown in FIG. 1.

It is possible to reduce the size (gate width) of the NMOS transistors TN1 and TN2 because the NMOS transistors TN3 and TN4 are employed. Hence, the impedance of the NMOS transistors TN1 and TN2 is increased, whereby the speed of charging that is performed after the transistors TN3 and TN4 are turned OFF can be slightly increased.

Figure 5:
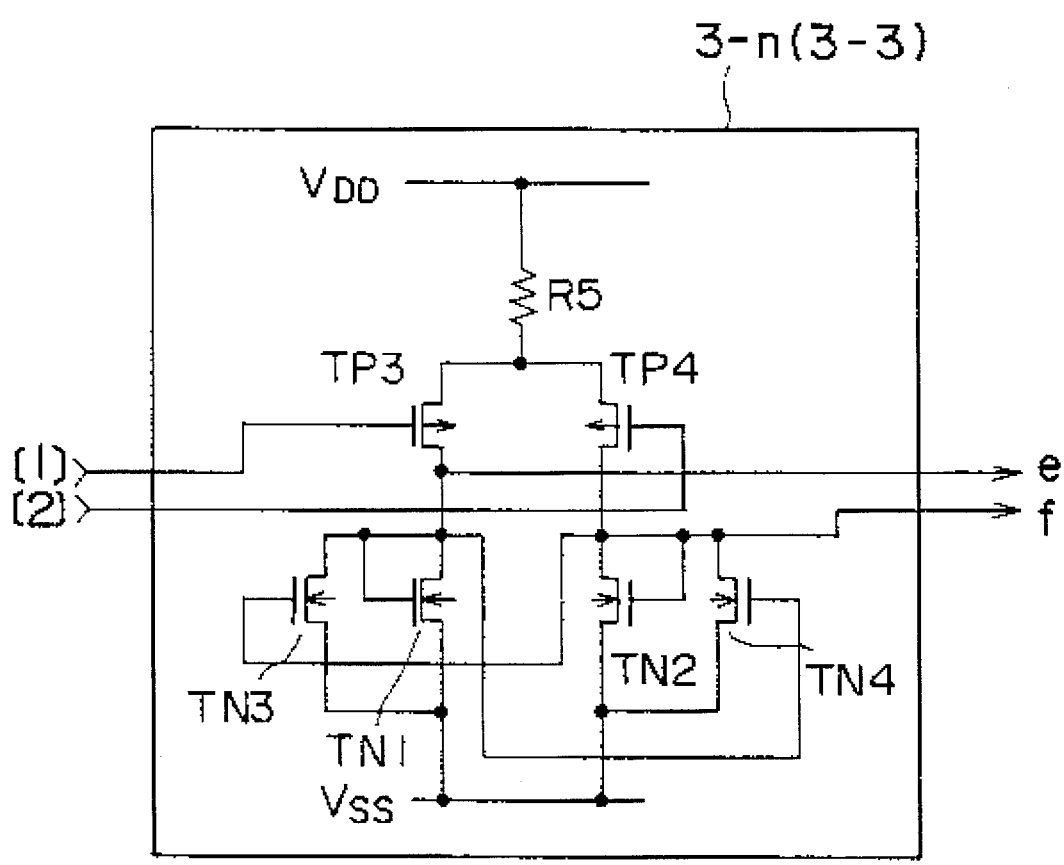
FIG. 5 is a circuit diagram of a differential amplifier circuit located at the final stage immediately before an output inverter circuit.

It is possible to configure the final-stage differential amplifier circuit 3-n as shown in FIG. 5, in which parts that are the same as those shown in the previously described figures are given the same reference numbers as previously. The output signals [1] and [2] of the (n−1)th differential amplifier circuit are applied to the gates of the PMOS transistors TP3 and TP4. The gate of the NMOS transistor TN3 is connected to the drain of the PMOS transistor TP4, and the gate of the NMOS transistor TN4 is connected to the drain of the PMOS transistor TP3.

When an output signal e of the final-stage circuit 3-n is switched towards the VDD level and an output signal f thereof is switched towards the VSS level, the potential of the gate of the NMOS transistor TN4 is increased, and the potential of the gate of the NMOS transistor TN3 is decreased. As the gate of the NMOS transistor TN4 is increased, the state of the transistor TN4 is changed towards ON, and the potential of the drain thereof is decreased. This decrease in the drain potential of the transistor TN4 causes the transistor TN3 to be changed towards OFF. As a result, the drain potential of the transistor TN3 is increased, and hence the state of the transistor TN4 is caused to further shift to the ON state. In this manner, the switching operation of the final-stage circuit 3-n can be improved.

Figure 6:
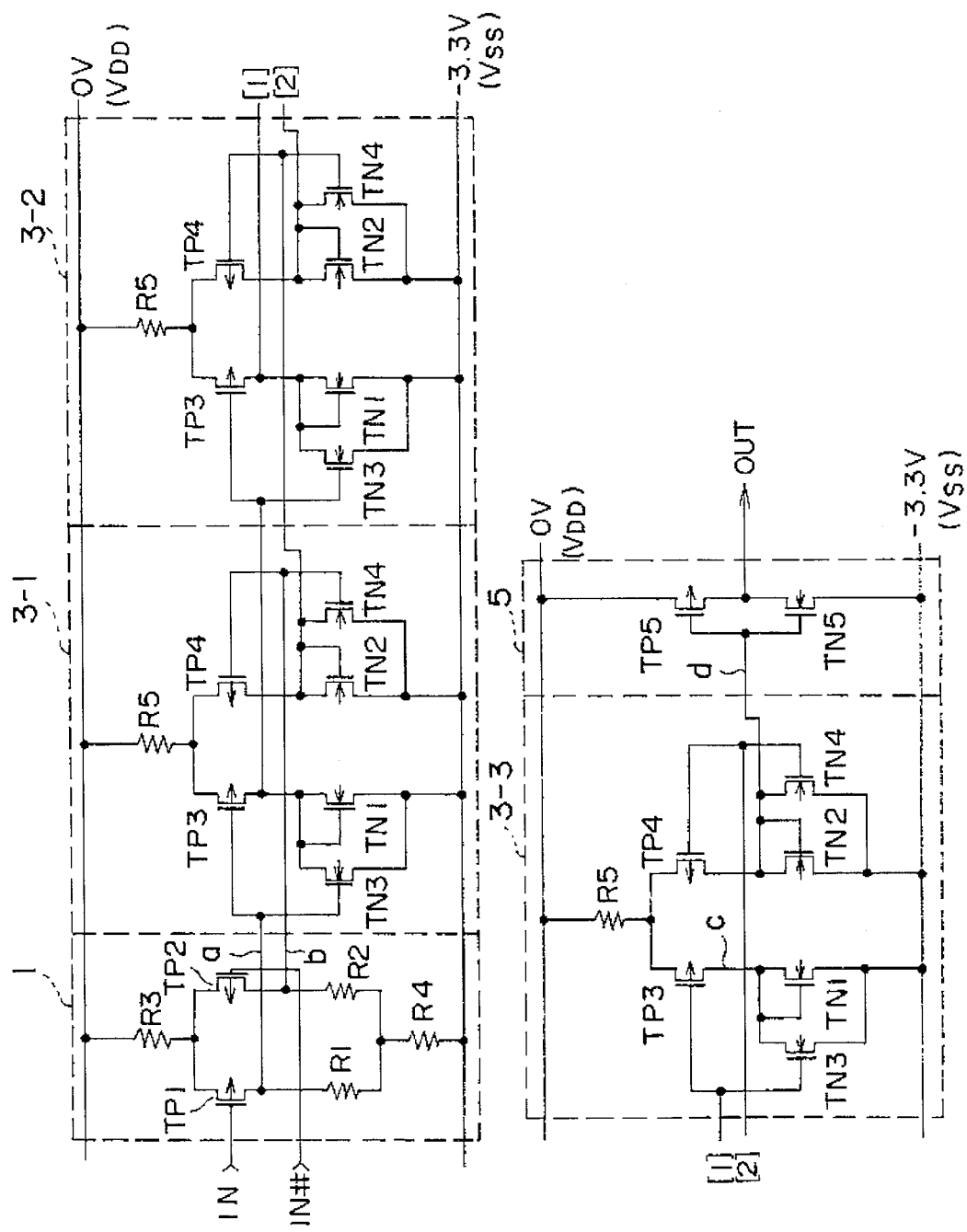
FIG. 6 is a circuit diagram of the overall ECL-CMOS level conversion circuit shown in FIG. 2.

FIG. 6 is a circuit diagram of the overall ECL-CMOS level conversion circuit having the circuit configurations shown in FIGS. 3 and 4. The ECL-CMOS level conversion circuit converts the ECL-level input signals IN and IN# varying between −1.8V and −0.9V to the CMOS-level signal varying between −3.0V and 0V. Instead of the final-stage differential amplifier circuit 3-3 shown in FIG. 6, it is possible to use the circuit configuration shown in FIG. 5.

A description will now be given, with reference to FIGS. 7, 8 and 9, of the characteristics of the circuit shown in FIGS. 1 and 6 obtained by a computer simulation. In the simulation, the values of the circuit parameters were selected as follows.

R1–R5: 1 kΩ

W of TP1, TP2 of circuit 1: 70 μm

L of TP1, TP2 of circuit 1: 0.5 μm

W of TP3, TP4 of circuit 3-1: 50 μm

Figure 7:
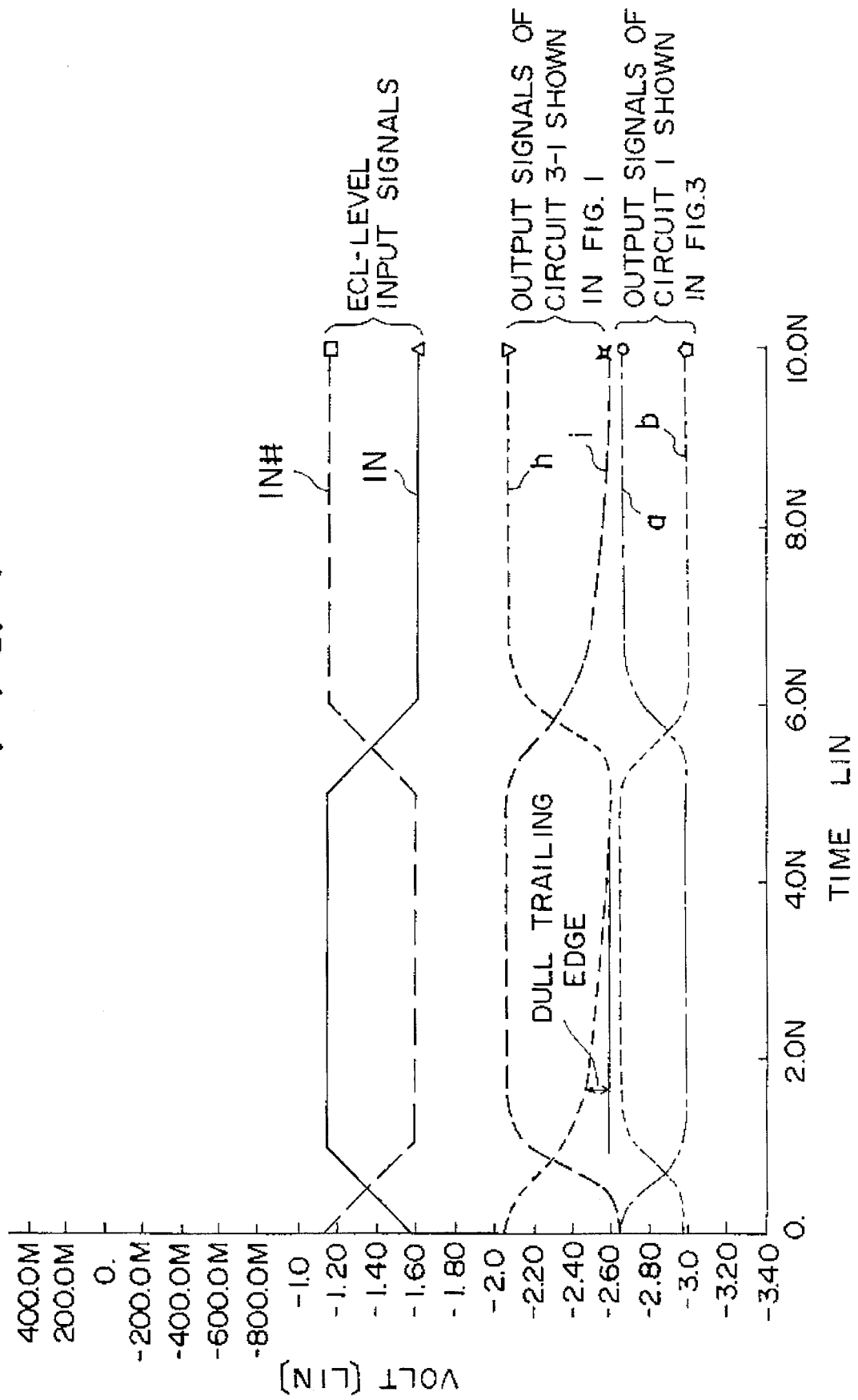
FIG. 7 is a graph of the characteristics of the input buffer circuit shown in FIG. 3 and a first-stage differential amplifier circuit shown in FIG. 1.

L of TP3, TP4 of circuit 3-1: 0.5 μm
W of TP3, TP4 of circuits 3-2, 3-3: 40 μm
L of TP3, TP4 of circuits 3-2, 3-3: 0.5 μm
W of TN1, TN2 of circuits 3-1, 3-2, 3-3: 10 μm
L of TN1, TN2 of circuits 3-1, 3-2, 3-3: 0.5 μm
W of TN3, TN4 of circuits 3-1, 3-2, 3-3: 5 μm
L of TN3, TN4 of circuits 3-1, 3-2, 3-3: 0.5 μm
W of TP5, TN5 of circuit 5: 30 μm
L of TP5, TN5 of circuit 5: 0.5 μm
W: channel width
L: channel length FIG. 7 shows the output signals a and b of the input buffer circuit 1 shown in FIGS. 3 and 6 according to the embodiment of the present invention, and the output signals h and i of the first-stage differential amplifier circuit 13-1 shown in FIG. 1 that directly receives the ECL-level input signals IN and IN#. In FIG. 7, the horizontal axis denotes the time (nanoseconds: N), and the vertical axis denotes the voltage (V). It can be seen from FIG. 7 that the output signals a and b of the input buffer circuit 1 have voltage levels lower than those of the output signals h and i of the first-stage differential amplifier circuit 13-1 shown in FIG. 1 and leading and trailing edges sharper than those of the output signals h and i.

FIG. 8 shows the output signals c and d of the final-stage differential amplifier circuit 3-3 shown in FIG. 6 according to the embodiment of the present invention, and the output signals j and k thereof in the configuration shown in FIG. 1. It can be seen from FIG. 8 that the output signals c and d of the final-stage differential amplifier circuit 3-3 shown in FIG. 6 vary in a voltage range broader than that of the output signals j and k. Particularly, the logical low level of the output signals c and d is much lower than that of the output signals j and k, and is very close to the low-potential power supply voltage VDD. Hence, the final-stage differential amplifier circuit 3-3 shown in FIG. 6 can operate more stably than the final-stage differential amplifier circuit 13-3 shown in FIG. 1.

FIG. 9 shows the CMOS-level output signal OUT of the output inverter circuit 5 shown in FIG. 6, and the CMOS-level output signal OUT of that shown in FIG. 1. It can be seen from FIG. 9 that the ECL-CMOS level conversion circuit shown in FIG. 6 has leading and trailing edges sharper than those of the signal OUT shown in FIG. 1 and hence can operate more stably and at higher speed than the ECL-CMOS level conversion circuit shown in FIG. 6.

It is possible to set one of the two differential signals to a reference voltage equal to, for example, −1.3V.

FIG. 10 shows the output signals c and d of 10 the final-stage differential amplifier circuit 3-3 shown in FIG. 6, and the output signals e and f of the final-stage differential amplifier circuit 3-3 shown in FIG. 5. The output signals e and f of the final-stage differential amplifier circuit 3-3 shown in FIG. 5 fall more rapidly than the output signals c and d, and the circuit 3-3 shown in FIG. 5 can operate at a speed faster than the circuit 3-3 shown in FIG. 6.

FIG. 11 shows the CMOS-level output signal OUT of the output inverter circuit 5 shown in FIG. 6, and the CMOS-level output signal OUT obtained when the final-stage differential amplifier circuit 3-3 shown in FIG. 5 is used. It can be seen from FIG. 11 that the ECL-CMOS level conversion circuit employing the final-stage circuit 3-3 shown in FIG. 5 has leading and trailing edges sharper than those of the signal OUT shown in FIG. 6 and hence can operate more stably and at higher speed than the ECL-CMOS level conversion circuit shown in FIG. 6.

FIG. 12 shows two chips A and B. The chip A includes a CMOS circuit area and a plurality of ECL-CMOS level conversion circuits according to the present invention. The chip B includes a CMOS circuit area and a plurality of CMOS-ECL level conversion circuits. In practice, the chip A includes CMOS-ECL level conversion circuits, and the chip B includes ECL-CMOS level conversion circuits.

The present invention is not limited to the specifically disclosed embodiments, and variations and modifications may be made without departing from the scope of the present invention.

What is claimed is:

1. A level conversion circuit for converting a pair of first-level signals into a pair of second-level signals, said level conversion circuit being supplied with a high-potential power supply voltage and a low-potential power supply voltage, said level conversion circuit comprising:

input buffer means for converting the pair of first-level signals into a pair of buffered signals which vary within a first voltage range situated below a second voltage range within which the pair of first-level signals vary; and an amplifier circuit comprising a plurality of CMOS differential amplifier circuits cascaded, the amplifier circuit converting the pair of buffered signals into the pair of second-level signals varying within a third voltage range broader than the second voltage range of the pair of first-level signals, wherein the input buffer means includes a first transistor having a source and drain and a second transistor having a source and drain, the source of the first transistor and the source of the second transistor is coupled to a first power supply the drain of the first transistor and the drain of the second transistor is coupled to a second power supply by way of a pair of buffered signals having a predetermined amplitude is output via connection nodes from the drain of the first transistor and the drain of the second transistor to the amplifier circuit.

2. The level conversion circuit as claimed in claim 1, wherein the second voltage range is situated above the low-potential power supply voltage.

3. The level conversion circuit as claimed in claim 1, wherein the input buffer circuit comprises a differential amplifier having a pair of MOS transistors.

4. The level conversion circuit as claimed in claim 1, wherein the input buffer circuit comprises:

a first P-channel MOS transistor having a source coupled to a first power supply line of the high-potential power supply voltage via a first resistance network, a gate receiving one of the pair of first-level signals, and a drain coupled to a second power supply line of the low-potential power supply voltage via a second resistance network; and a second P-channel MOS transistor having a source coupled to the first power supply line via the first resistance network, a gate receiving the other one of the pair of the first-level signals, and a drain coupled to the second power supply line via the second resistance network.

5. A level conversion circuit for converting a pair of first-level signals into a pair of second-level signals, said level conversion circuit being supplied with a high-potential power supply voltage and a low-potential power supply voltage, said level conversion circuit comprising:

input buffer means for converting the pair of first-level signals into a pair of buffered signals which vary within a first voltage range situated below a second voltage range within which the pair of first-level signals vary; and an amplifier circuit comprising a plurality of CMOS differential amplifier circuits cascaded, the amplifier circuit converting the pair of buffered signals into the pair of second-level signals varying within a third voltage range broader than the second voltage range of the pair of first-level signals, wherein the input buffer circuit comprises:

a first P-channel MOS transistor having a source coupled to a first power supply line of the high-potential power supply voltage via a first resistance network, a gate receiving one of the pair of first-level signals, and a drain coupled to a second power supply line of the low-potential power supply voltage via a second resistance network; and a second P-channel MOS transistor having a source coupled to the first power supply line via the first resistance network, a gate receiving the other one of the pair of the first-level signals, and a drain coupled to the second power supply line via the second resistance network, and wherein the first resistance network comprises a first resistance element connected between the first power supply line and the sources of the first and second P-channel MOS transistors; and wherein the second resistance network comprises:

a first resistance element having a first end connected to the drain of the first P-channel MOS transistor, and a second end;

a second resistance element having a third end connected to the drain of the second P-channel MOS transistor, and a fourth end; and a third resistance element having a fifth end connected to the second and fourth ends, and a sixth end connected to the second power supply line, the pair of buffered signals being output via the drains of the first and second P-channel MOS transistors.

6. A level conversion circuit for converting a pair of first-level signals into a pair of second-level signals, said level conversion circuit being supplied with a high-potential power supply voltage and a low-potential power supply voltage, said level conversion circuit comprising:

input buffer means for converting the pair of first-level signals into a pair of buffered signals which vary within a first voltage range situated below a second voltage range within which the pair of first-level signals vary; and an amplifier circuit comprising a plurality of CMOS differential amplifier circuits cascaded, the amplifier circuit converting the pair of buffered signals into the pair of second-level signals varying within a third voltage range broader than the second voltage range of the pair of first-level signals, wherein an ith CMOS differential amplifier circuit among the plurality of CMOS differential amplifier circuits comprises:

a first P-channel MOS transistor having a source connected to a first power supply line of the high-potential power supply voltage via a resistance element, a drain via which a first output signal is output to an (i+1)th CMOS differential amplifier circuit, and a gate receiving a first input signal from an (i−1)th CMOS differential amplifier circuit;

a second P-channel MOS transistor having a source connected to the first power supply line of the high-potential power supply voltage via the resistance element, a drain via which a second output signal is output to the (i+1)th CMOS differential amplifier circuit;

a first N-channel MOS transistor having a drain connected to the drain of the first P-channel MOS transistor, a source coupled to a second power supply line of the low-potential power supply voltage, and a gate connected to the drain of the first N-channel MOS transistor; and a second N-channel MOS transistor having a drain connected to the drain of the second P-channel MOS transistor, a source coupled to the second power supply line, and a gate connected to the drain of the second N-channel MOS transistor.

7. The level conversion circuit as claimed in claim 6, further comprising discharging means for discharging the drains of the first and second P-channel MOS transistors in response to the first and second input signals.

8. The level conversion circuit as claimed in claim 6, further comprising:

a third N-channel MOS transistor having a drain connected to the gate and drain of the first N-channel MOS transistor, a source connected to the source of the first N-channel MOS transistor, and a gate receiving the first input signal; and a fourth N-channel MOS transistor having a drain connected to the gate and drain of the second N-channel MOS transistor, a source connected to the source of the second N-channel MOS transistor, and a gate receiving the second input signal.

9. A level conversion circuit for converting a pair of first-level signals into a pair of second-level signals, said level conversion circuit being supplied with a high-potential power supply voltage and a low-potential power supply voltage, said level conversion circuit comprising:

input buffer means for converting the pair of first-level signals into a pair of buffered signals which vary within a first voltage range situated below a second voltage range within which the pair of first-level signals vary; and an amplifier circuit comprising a plurality of CMOS differential amplifier circuits cascaded, the amplifier circuit converting the pair of buffered signals into the pair of second-level signals varying within a third voltage range broader than the second voltage range of the pair of first-level signals, wherein one of the plurality of CMOS differential amplifier circuits comprises:

a first P-channel MOS transistor having a source connected to a first power supply line of the high-potential power supply voltage via a resistance element, a drain via which a first output signal is output to an (i+1)th CMOS differential amplifier circuit, and a gate receiving a first input signal from an (i−1)th CMOS differential amplifier circuit;

a second P-channel MOS transistor having a source connected to the first power supply line of the high-potential power supply voltage via the resistance element, a drain via which a second output signal is output to the (i+1)th CMOS differential amplifier circuit, and a gate receiving a second input signal from the (i−1)th CMOS differential amplifier circuit;

a first N-channel MOS transistor having a drain connected to the drain of the first P-channel MOS transistor, a source coupled to a second power supply line of the low-potential power supply voltage, and a gate connected to the drain of the first N-channel MOS transistor;

a second N-channel MOS transistor having a drain connected to the drain of the second P-channel MOS transistor, a source coupled to the second power supply line, and a gate connected to the drain of the second N-channel MOS transistor; and discharging means for discharging the drains of the first and second P-channel MOS transistors in response to the second and first output signals.

10. The level conversion circuit as claimed in claim 9, wherein said discharging means comprises:

a third N-channel MOS transistor having a drain connected to the gate and drain of the first N-channel MOS transistor, a source connected to the source of the first N-channel MOS transistor, and a gate receiving the second output signal; and a fourth N-channel MOS transistor having a drain connected to the gate and drain of the second N-channel MOS transistor, a source connected to the source of the second N-channel MOS transistor, and a gate receiving the first output signal.

11. A level conversion circuit for converting a pair of first-level signals into a pair of second-level signals, said level conversion circuit being supplied with a high-potential power supply voltage and a low-potential power supply voltage, said level conversion circuit comprising:

input buffer means for converting the pair of first-level signals into a pair of buffered signals which vary within a first voltage range situated below a second voltage range within which the pair of first-level signals vary;

an amplifier circuit comprising a plurality of CMOS differential amplifier circuits cascaded, the amplifier circuit converting the pair of buffered signals into the pair of second-level signals varying within a third voltage range broader than the second voltage range of the pair of first-level signals; and output buffer means for converting the pair of second-level signals into an output signal.

12. The level conversion circuit as claimed in claim 11, wherein the output buffer means comprises a CMOS inverter.

13. The level conversion circuit as claimed in claim 1, wherein the pair of first-level signals is a pair of ECL-level signals, and the pair of second-level signals is a pair of CMOS-level signals.

* * * * *

UNITED STATES PATENT AND TRADEMARK OFFICE
CERTIFICATE OF CORRECTION

PATENT NO. : 5,585,743
DATED : December 17, 1996
INVENTOR(S) : Hisashige KENJI, et al.

It is certified that error appears in the above-indentified patent and that said Letters Patent is hereby corrected as shown below:

Col. 3, line 17, delete "10" and start a new paragraph with "The input buffer circuit 1".

Col. 5, line 52, delete "10".

Col. 6, line 40 (Claim 1, line 24), after "of" insert --two resistors, and--.

Signed and Sealed this

Eighth Day of April, 1997

Attest:

BRUCE LEHMAN

Attesting Officer      Commissioner of Patents and Trademarks